United States Patent
Tam et al.

(10) Patent No.: US 9,356,554 B2
(45) Date of Patent: May 31, 2016

(54) RELAXATION OSCILLATOR WITH CURRENT AND VOLTAGE OFFSET CANCELLATION

(71) Applicant: Texas Instruments Incorporated, Dallas, TX (US)

(72) Inventors: Kai Yiu Tam, Santa Clara, CA (US); Ali Kiaei, San Jose, CA (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/329,939

(22) Filed: Jul. 12, 2014

(65) Prior Publication Data

US 2016/0013753 A1  Jan. 14, 2016

(51) Int. Cl.
 *H03K 3/30* (2006.01)
 *H03B 5/04* (2006.01)
 *H03K 4/50* (2006.01)
 *H03K 4/02* (2006.01)
 *H03B 5/24* (2006.01)

(52) U.S. Cl.
 CPC .. *H03B 5/04* (2013.01); *H03B 5/24* (2013.01); *H03K 4/023* (2013.01); *H03K 4/50* (2013.01)

(58) Field of Classification Search
 CPC ..... H03K 3/0231; H03K 3/011; H03K 3/023; H03K 4/50; H03B 5/24; H03B 5/04

USPC .................................................. 331/111, 143
 See application file for complete search history.

(56) References Cited

U.S. PATENT DOCUMENTS

| | | | |
|---|---|---|---|
| 7,034,627 B1 | 4/2006 | Kudari | |
| 8,912,855 B2 * | 12/2014 | Hsiao | 331/143 |
| 2012/0086515 A1 | 4/2012 | Yang et al. | |
| 2013/0200956 A1 | 8/2013 | Hsiao | |

OTHER PUBLICATIONS

Paidimarri, Arun et al., "A 120nW 18.5kHz RC Oscillator with Comparator Offset Cancellation for ±0.25% Temperature Stability", 2013 International Solid-State Circuits Conference (ISSCC), Session 10, Analog Techniques, 10.7, Digest of Technical papers, pp. 184-185 plus one page continuation.
International Search Report and Written Opinion for PCT/US2015/040166 mailed Dec. 17, 2015.

* cited by examiner

*Primary Examiner* — Arnold Kinkead
(74) *Attorney, Agent, or Firm* — Michael A. Davis, Jr.; Frank D. Cimino

(57) ABSTRACT

A relaxation oscillator reduces temperature sensitivity and phase noise at low offset frequency by periodically swapping a first current and a second current so that after the first current has been input to a first pair of circuits and the second current has been input to a second pair of circuits, the second current is input to the first pair of circuits and the first current is input to the second pair of circuits.

16 Claims, 6 Drawing Sheets

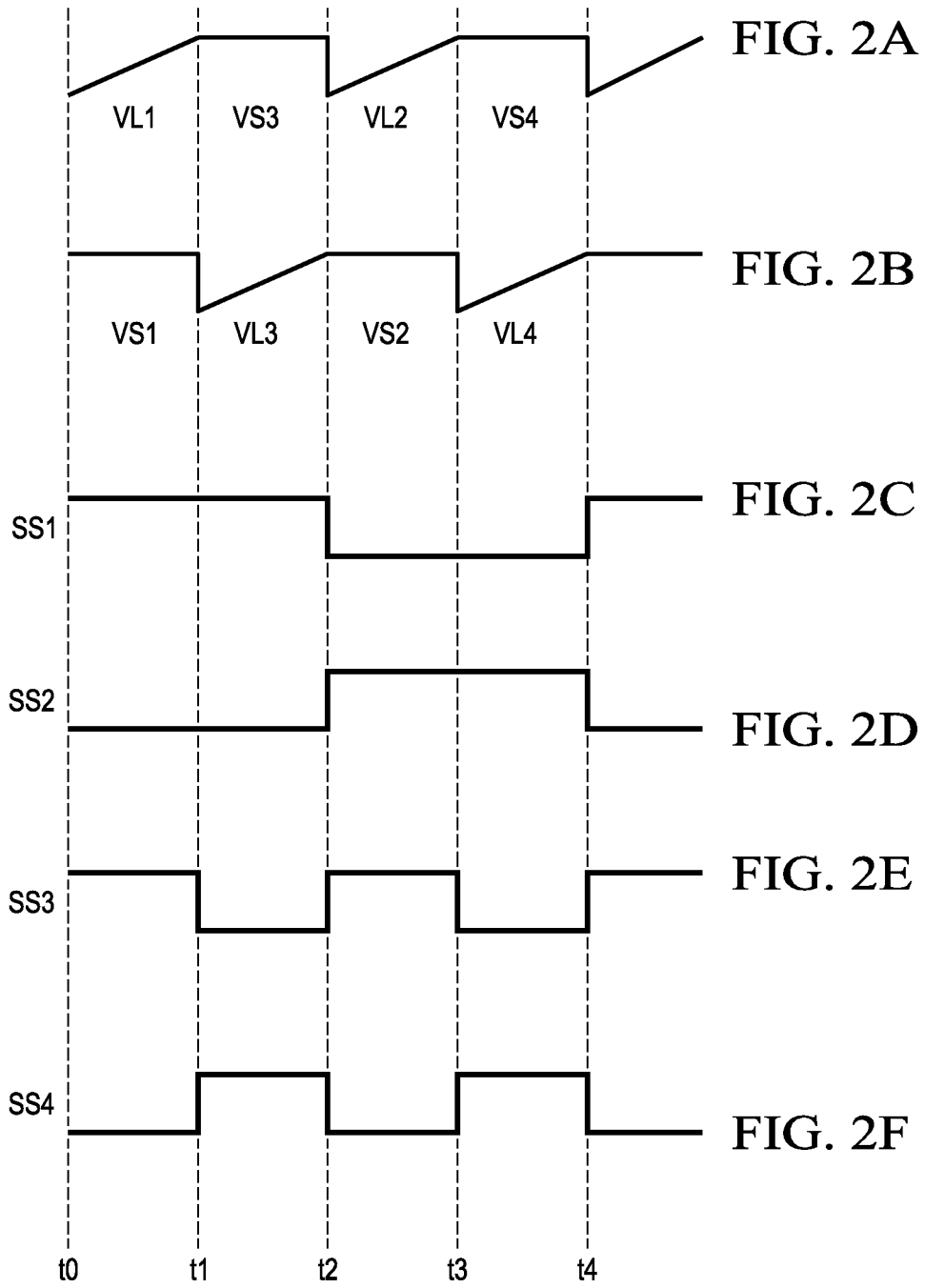

RELAXATION OSCILLATOR WITH CURRENT AND VOLTAGE OFFSET CANCELLATION

BACKGROUND

The disclosures herein relate in general to electronic circuitry, and in particular to a method and circuitry for a relaxation oscillator with current and voltage offset cancellation.

A relaxation oscillator is a well-known circuit that generates a periodic non-sinusoidal output signal, such as square and triangular waveforms. Relaxation oscillators are used in many applications, such as computer applications where the square wave is used to provide a clock signal.

Relaxation oscillators are commonly implemented as a resistor-capacitor (RC) circuit in combination with a threshold sensitive device. A current flowing through the resistor charges up the capacitor. The threshold sensitive device does not respond to the voltage on the capacitor until the voltage on the capacitor exceeds the threshold of the device, at which time the device turns on and discharges the capacitor. This process is then continuously repeated as long as the circuit is energized.

One problem with relaxation oscillators is that the oscillation frequency of a relaxation oscillator is strongly temperature dependent. Relaxation oscillators commonly include two current sources: a first current source that outputs a first current, and a second current source that outputs a second current. In an ideal relaxation oscillator, the first current and the second current are exactly equal when there is a constant temperature, and change by the same amount as the temperature varies.

In actual practice, however, the first current and the second current are often slightly different when the temperature is constant, and change by differing amounts as the temperature varies. The first and second currents are said to be different by a current offset, even when temperature does not change. The current offset is a statistical value that results, in part, from transistor mismatch. (Transistor mismatch is the difference between transistors, which are intended to be identical, that results from, for example, random variations in the fabrication process.)

The current offset is strongly temperature dependent in that small changes in temperature can lead to substantial changes in the difference between the first and second currents. The oscillation frequency of the resonant oscillator, in turn, varies in response to the differences between the first and second currents, which vary strongly with temperature.

Another problem with relaxation oscillators is that relaxation oscillators frequently suffer from phase noise at low offset frequency. Relaxation oscillators commonly include a comparator that has a positive input terminal and a negative input terminal. In an ideal relaxation oscillator, the comparator detects the moment that the voltage on one input terminal exceeds the voltage on the other input terminal.

In actual practice, however, there is a slight difference between when the comparator detects the voltage on one of the input terminals exceeding the voltage on the other input terminal, and when the voltage on the one input terminal actually exceeded the voltage on the other input terminal. The difference in timing is said to be due to an offset voltage which causes the comparator to trigger at a time that is slightly different from when the event actually occurred. The offset voltage is a non-ideality of the comparator that results, in part, from transistor mismatch. The exact amount of the offset voltage is unpredictable because it is a statistical value. Since the offset voltage alters the timing of the comparator, the offset voltage introduces phase noise at low offset frequency.

SUMMARY

The present disclosure provides circuitry for a relaxation oscillator that cancels the current and voltage offsets to reduce temperature sensitivity and phase noise at low offset frequency. Circuitry for the relaxation oscillator includes a current swapping circuit that has a first output and a second output. The current swapping circuit is for sourcing a first current from the first output and a second current from the second output in response to a first logic state of a first switching signal and a second logic state of a second switching signal. The current swapping circuit is also for sourcing the first current from the second output and the second current from the first output in response to a second logic state of the first switching signal and a first logic state of the second switching signal. The relaxation oscillator circuitry additionally includes a first current leg coupled to the first output of the current swapping circuit. The first current leg is for receiving the first current when sourced from the first output and generating a first leg voltage from the first current in response to a first logic state of a third switching signal and a second logic state of a fourth switching signal. The first current leg is also for receiving the second current when sourced from the first output and generating a second leg voltage from the second current in response to the first logic state of the third switching signal and the second logic state of the fourth switching signal.

A method of operating a relaxation oscillator includes sourcing a first current from a first output and a second current from a second output in response to a first logic state of a first switching signal and a second logic state of a second switching signal. The method also includes sourcing the first current from the second output and the second current from the first output in response to a second logic state of the first switching signal and a first logic state of the second switching signal. The method further includes receiving the first current when sourced from the first output and generating a first leg voltage from the first current in response to a first logic state of a third switching signal and a second logic state of a fourth switching signal. The method additionally includes receiving the second current when sourced from the first output and generating a second leg voltage from the second current in response to the first logic state of the third switching signal and the second logic state of the fourth switching signal.

BRIEF DESCRIPTION OF THE DRAWINGS

FIGS. 2A-2F are timing diagrams of the operation of switching control circuit 150 of FIG. 1. FIG. 2A is a timing diagram of the voltages received by the first input of switching control circuit 150. FIG. 2B is a timing diagram of the voltages received by the second input of switching control circuit 150. FIG. 2C is a timing diagram of the first switching signal SS1. FIG. 2D is a timing diagram of the second switching signal SS2. FIG. 2E is a timing diagram of the third switching signal SS3. FIG. 2F is a timing diagram of the fourth switching signal SS4.

DETAILED DESCRIPTION

Figure 1:
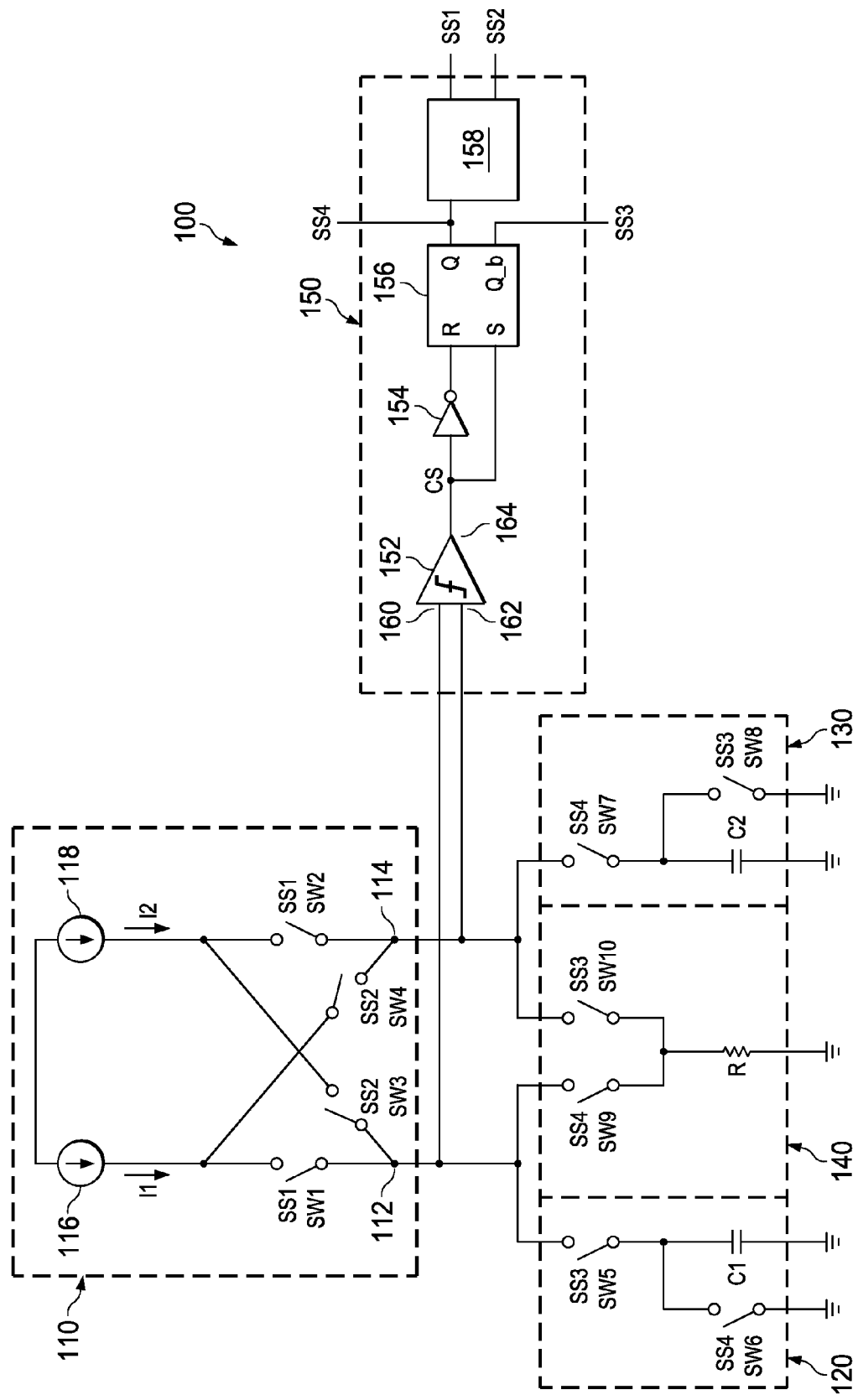
FIG. 1 is a schematic diagram of circuitry for a relaxation oscillator 100 of the illustrative embodiments.

FIG. 1 is a schematic diagram of circuitry, indicated generally at 100, for a relaxation oscillator. As described in greater detail below, relaxation oscillator 100 reduces temperature sensitivity and phase noise at low offset frequency by periodically swapping a pair of currents so that a first pair of circuits and a second pair of circuits alternately receive the pair of currents.

As shown in FIG. 1, relaxation oscillator 100 includes a current swapping circuit 110 that has a first output 112 and a second output 114. Current swapping circuit 110 sources a first current I1 from the first output 112 and a second current I2 from the second output 114 in response to the first logic state of a first switching signal SS1 and the second logic state of a second switching signal SS2. Current swapping circuit 110 also sources the first current I1 from the second output 114 and the second current I2 from the first output 112 in response to the second logic state of the first switching signal SS1 and the first logic state of the second switching signal SS2.

In the present example, current swapping circuit 110 is implemented with a current source 116 that generates the first current I1, and a current source 118 that generates the second current I2. Current swapping circuit 110 is also implemented with a switch SW1 and a switch SW2.

Switch SW1 has a control terminal coupled (e.g., connected) to receive the first switching signal SS1, a first terminal coupled to current source 116, and a second terminal coupled to the first output 112. Switch SW2 has a control terminal coupled to receive the first switching signal SS1, a first terminal coupled to current source 118, and a second terminal coupled to the second output 114.

Current swapping circuit 110 is further implemented with a switch SW3 and a switch SW4. Switch SW3 has a control terminal coupled to receive the second switching signal SS2, a first terminal coupled to current source 118, and a second terminal coupled to the first output 112. Switch SW4 has a control terminal coupled to receive the second switching signal SS2, a first terminal coupled to current source 116, and a second terminal coupled to the second output 114.

As further shown in FIG. 1, relaxation oscillator 100 additionally includes a first current leg 120 that is coupled to the first output 112 of current swapping circuit 110. In addition, first current leg 120 is also coupled to receive a third switching signal SS3 and a fourth switching signal SS4.

First current leg 120 receives the first current I1 when sourced from the first output 112, and generates a first leg voltage from the first current I1 in response to a first logic state of the third switching signal SS3 and a second logic state of the fourth switching signal SS4. First current leg 120 generates the first leg voltage so that the magnitude of the first leg voltage increases over time.

When the logic state of the third switching signal SS3 changes from the first logic state to a second logic state and the logic state of the fourth switching signal SS4 changes from the second logic state to a first logic state, first current leg 120 blocks the first current I1 and discharges the first leg voltage.

In addition, first current leg 120 receives the second current I2 when sourced from the first output 112, and generates a second leg voltage from the second current I2 in response to the first logic state of the third switching signal SS3 and the second logic state of the fourth switching signal SS4. First current leg 120 generates the second leg voltage so that the magnitude of the second leg voltage increases over time.

When the logic state of the third switching signal SS3 changes from the first logic state to the second logic state and the logic state of the fourth switching signal changes from the second logic state to the first logic state, first current leg 120 blocks the second current I2 and discharges the second leg voltage.

In the present example, first current leg 120 is implemented with a switch SW5, a switch SW6, and a capacitor C1. Switch SW5 has a control terminal coupled to receive the third switching signal SS3, a first terminal coupled to the first output 112, and a second terminal. Switch SW6 has a control terminal coupled to receive the fourth switching signal SS4, a first terminal coupled to the second terminal of switch SW5, and a second terminal coupled to ground. Capacitor C1 has a top plate coupled to the second terminal of switch SW5, and a bottom plate coupled to ground.

As additionally shown in FIG. 1, relaxation oscillator 100 further includes a second current leg 130 that is coupled to the second output 114 of current swapping circuit 110. Second current leg 130 is also coupled to receive the third switching signal SS3 and the fourth switching signal SS4.

Second current leg 130 receives the second current I2 when sourced from the second output 114, and generates a third leg voltage from the second current I2 in response to the second logic state of the third switching signal SS3 and the first logic state of the fourth switching signal SS4. Second current leg 130 generates the third leg voltage so that the magnitude of the third leg voltage increases over time.

When the logic state of the third switching signal SS3 changes from the second logic state to the first logic state and the logic state of the fourth switching signal changes from the first logic state to the second logic state, second current leg 130 blocks the second current I2 and discharges the third leg voltage.

In addition, second current leg 130 receives the first current I1 when sourced from the second output 114, and generates a fourth leg voltage from the first current I1 in response to the second logic state of the third switching signal SS3 and the first logic state of the fourth switching signal SS4. Second current leg 130 generates the fourth leg voltage so that the magnitude of the fourth leg voltage increases over time.

When the logic state of the third switching signal SS3 changes from the second logic state to the first logic state and the logic state of the fourth switching signal changes from the first logic state to the second logic state, second current leg 130 blocks the first current I1 and discharges the fourth leg voltage.

In the present example, second current leg 130 is implemented with a switch SW7, a switch SW8, and a capacitor C2. Switch SW7 has a control terminal coupled to receive the fourth switching signal SS4, a first terminal coupled to the second output 114, and a second terminal. Switch SW8 has a control terminal coupled to receive the third switching signal SS3, a first terminal coupled to the second terminal of switch SW7, and a second terminal coupled to ground. Capacitor C2 has a top plate coupled to the second terminal of switch SW7, and a bottom plate coupled to ground.

As further shown in FIG. 1, relaxation oscillator 100 additionally includes a shared current leg 140 that is coupled to the first output 112 and the second output 114 of current swapping circuit 110. Shared current leg 140 is also coupled to receive the third switching signal SS3 and the fourth switching signal SS4.

Shared current leg 140 receives the second current I2 when sourced from the second output 114, and generates a first shared voltage from the second current I2 in response to the first logic state of the third switching signal SS3 and the second logic state of the fourth switching signal SS4. Shared current leg 140 generates the first shared voltage so that the magnitude of the first shared voltage is substantially constant over time.

Shared current leg 140 also receives the first current I1 when sourced from the second output 114, and generates a second shared voltage from the first current I1 in response to the first logic state of the third switching signal SS3 and the second logic state of the fourth switching signal SS4. Shared current leg 140 generates the second shared voltage so that the magnitude of the second shared voltage is substantially constant over time.

In addition, shared current leg 140 receives the first current I1 when sourced from the first output 112, and generates a third shared voltage from the first current I1 in response to the second logic state of the third switching signal SS3 and the first logic state of the fourth switching signal SS4. Shared current leg 140 generates the third shared voltage so that the magnitude of the third shared voltage is substantially constant over time.

Further, shared current leg 140 receives the second current I2 when sourced from the first output 112, and generates a fourth shared voltage from the second current I2 in response to the second logic state of the third switching signal SS3 and the first logic state of the fourth switching signal SS4. Shared current leg 140 generates the fourth shared voltage so that the magnitude of the fourth shared voltage is substantially constant over time.

In the present example, shared current leg 140 is implemented with a switch SW9, a switch SW10, and a resistor R. Switch SW9 has a control terminal coupled to receive the fourth switching signal SS4, a first terminal coupled to the first output 112, and a second terminal. Switch SW10 has a control terminal coupled to receive the third switching signal SS3, a first terminal coupled to the second output 114, and a second terminal. Resistor R has a first end coupled to the second terminal of switch SW9 and the second terminal of switch SW10, and a second end coupled to ground.

The switches SW1-SW10 can be implemented in a number of ways. For example, the switches SW1-SW10 can be implemented as transistors, such as NMOS transistors. When an NMOS transistor is utilized, the control terminal can be the gate, the first terminal can be the drain, and the second terminal can be the source.

As additionally shown in FIG. 1, relaxation oscillator 100 includes a switching control circuit 150 that is coupled to current swapping circuit 110, first current leg 120, second current leg 130, and shared current leg 140. Switching control circuit 150 receives a number of voltages, and generates the first, second, third, and fourth switching signals SS1, SS2, SS3, and SS4 in response to the voltages. The voltages include the first, second, third, and fourth leg voltages, and the first, second, third, and fourth shared voltages.

Switching control circuit 150 has a first input and a second input. The first input sequentially receives the first leg voltage, the third shared voltage, the second leg voltage, and the fourth shared voltage. The second input sequentially receives the first shared voltage, the third leg voltage, the second shared voltage, and the fourth leg voltage.

Switching control circuit 150 compares the first leg voltage to the first shared voltage, and changes the logic states of the third switching signal SS3 and the fourth switching signal SS4 when the first leg voltage, which increases over time, exceeds the first shared voltage, which is substantially constant.

Switching control circuit 150 next compares the third leg voltage to the third shared voltage, and changes the logic states of the first switching signal SS1, the second switching signal SS2, the third switching signal SS3, and the fourth switching signal SS4 when the third leg voltage, which increases over time, exceeds the third shared voltage, which is substantially constant.

After this, switching control circuit 150 compares the second shared voltage to the second leg voltage, and changes the logic states of the third switching signal SS3 and the fourth switching signal SS4 when the second leg voltage, which increases over time, exceeds the second shared voltage, which is substantially constant.

Switching control circuit 150 then compares the fourth shared voltage to the fourth leg voltage, and changes the logic states of the first switching signal SS1, the second switching signal SS2, the third switching signal SS3, and the fourth switching signal SS4 when the fourth leg voltage, which increases over time, exceeds the fourth shared voltage, which is substantially constant.

FIGS. 2A-2F are timing diagrams of the operation of switching control circuit 150 of relaxation oscillator 100. FIG. 2A is a timing diagram of the voltages received by the first input of switching control circuit 150, while FIG. 2B is a timing diagram of the voltages received by the second input of switching control circuit 150. FIG. 2C is a timing diagram of the first switching signal SS1, while FIG. 2D is a timing diagram of the second switching signal SS2. FIG. 2E is a timing diagram of the third switching signal SS3, while FIG. 2F is a timing diagram of the fourth switching signal SS4.

As shown in FIGS. 2A-2B, the first leg voltage VL1 and the first shared voltage VS1 occur during the same time, while the second leg voltage VL2 and the second shared voltage VS2 occur at the same time. In addition, the third leg voltage VL3 and the third shared voltage VS3 occur at the same time, while the fourth leg voltage VL4 and the fourth shared voltage VS4 occur at the same time.

As shown in FIGS. 2C-2F, the second switching signal SS2 is the inverse of the first switching signal SS1, while the fourth switching signal SS4 is the inverse of the third switching signal SS3. In addition, the first switching signal SS1 has a period that is twice the period of the third switching signal SS3. Further, the first switching signal SS1 has a rising edge that is substantially synchronized with a first rising edge of the third switching signal SS3, and a falling edge that is substantially synchronized with a second rising edge of the third switching signal SS3.

As further shown in FIGS. 2A-2F, power is applied at time t0. In the present example, when power is applied, switching control circuit 150 outputs the first switching signal SS1 with a logic high, the second switching signal SS2 with a logic low, the third switching signal SS3 with a logic high, and the fourth switching signal SS4 with a logic low.

Figure 3A:
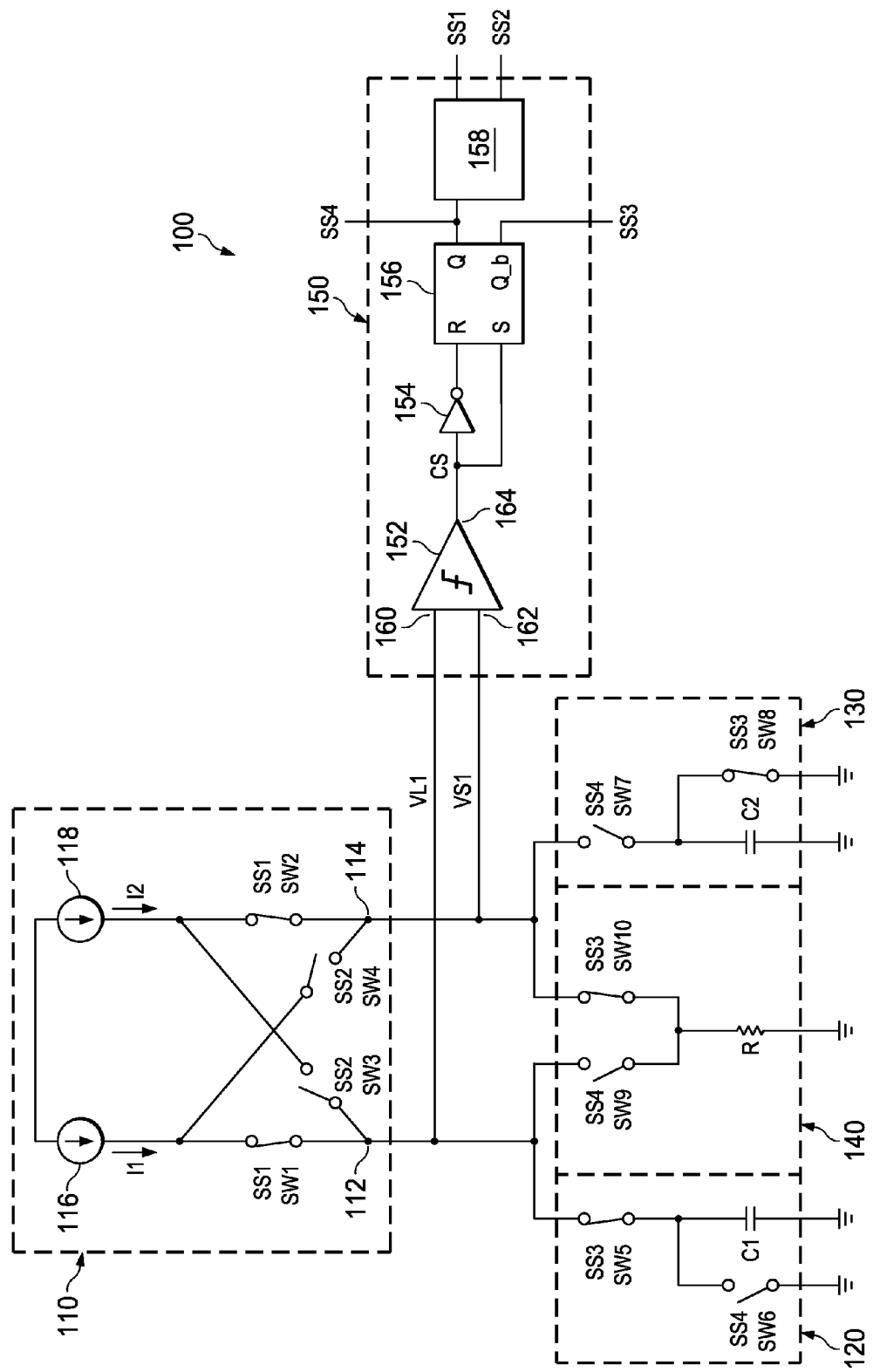
FIGS. 3A-3D are schematic diagrams of the operation of relaxation oscillator 100.

FIGS. 3A-3D are schematic diagrams of the operation of relaxation oscillator 100. As shown in FIG. 3A, when the first switching signal SS1 and the third switching signal SS3 have logic high states, and the second switching signal SS2 and the fourth switching signal SS4 have logic low states, the switches SW1, SW2, SW5, SW8, and SW10 close, while the switches SW3, SW4, SW6, SW7, and SW9 open.

In this state, capacitor C2 discharges through switch SW8, while the first current I1 from current source 116 flows through switch SW1, the first output 112, and switch SW5 to capacitor C1, where the first current I1 charges up capacitor C1 to generate the first leg voltage VL1. As shown in FIG. 2A, the first input of switching control circuit 150 receives the first leg voltage VL1, which increases over the time t0-t1.

At the same time, the second current I2 from current source 118 flows through switch SW2, the second output 114, switch SW10, and resistor R. The second current I2 through resistor R generates the first shared voltage VS1. As shown in FIG. 2B, the second input of switching control circuit 150 receives the first shared voltage VS1, which is substantially constant over the time t0-t1.

Referring again to FIGS. 2A-2B, at time t1, the first leg voltage VL1 on the first input of switching control circuit 150 exceeds the first shared voltage VS1 on the second input of switching control circuit 150. As shown in FIGS. 2C-2F, when the first leg voltage VL1 exceeds the first shared voltage VS1, switching control circuit 150 changes the logic state of the third switching signal SS3 from a logic high to a logic low, and changes the logic state of the fourth switching signal SS4 from a logic low to a logic high.

Figure 3B:
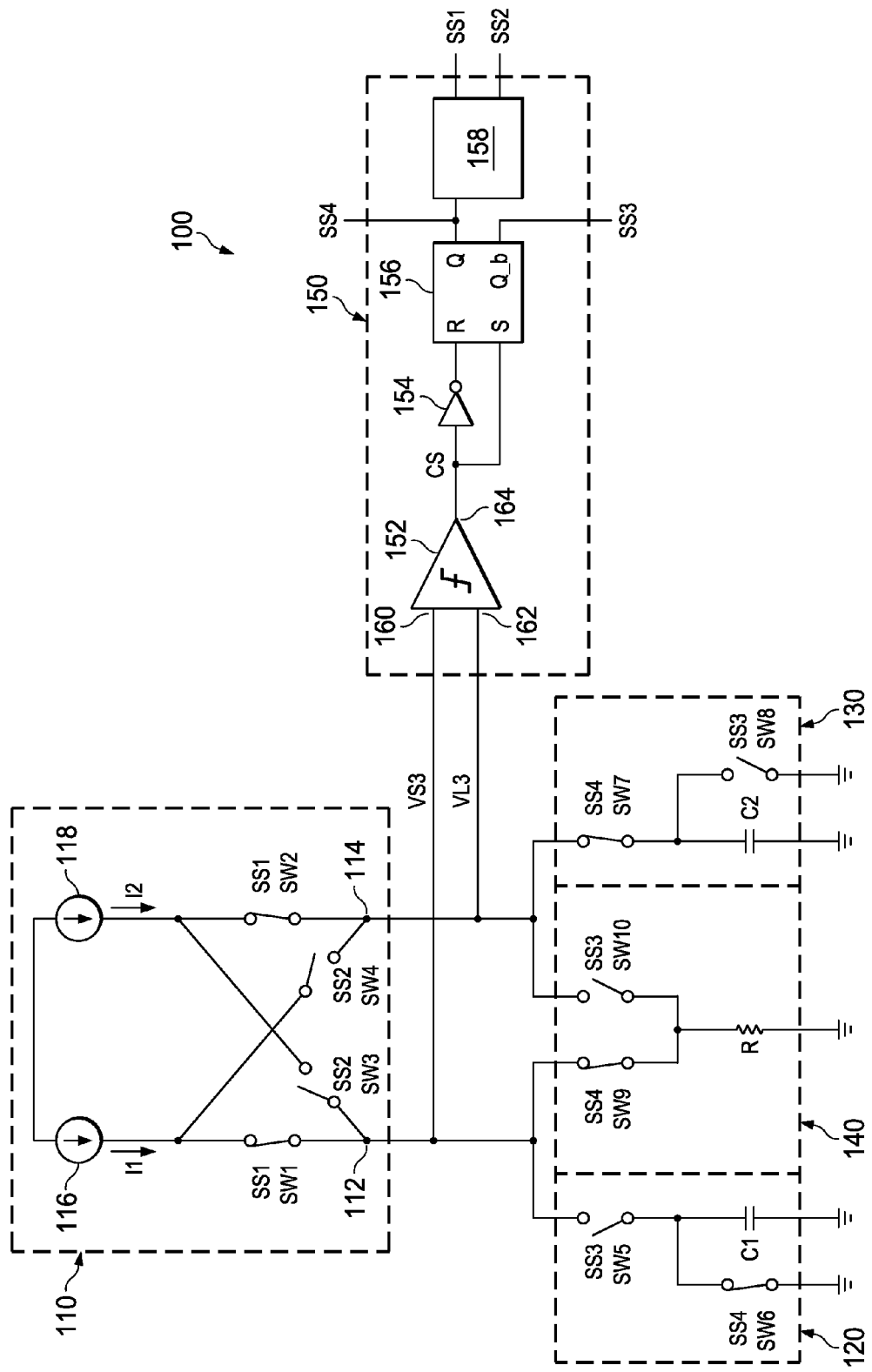

As shown in FIG. 3B, when the third switching signal SS3 changes to a logic low state and the fourth switching signal SS4 changes to a logic high state, the switches SW5, SW8, and SW10 open, while the switches SW6, SW7, and SW9 close. The switches SW1 and SW2 remain closed, while the switches SW3 and SW4 remain open.

In this state, capacitor C1 discharges through switch SW6, while the second current I2 from current source 118 flows through switch SW2, the second output 114, and switch SW7 to capacitor C2, where the second current I2 charges up capacitor C2 to generate the third leg voltage VL3. As shown in FIG. 2B, the second input of switching control circuit 150 receives the third leg voltage VL3, which increases over the time t1-t2.

At the same time, the first current I1 from current source 116 flows through switch SW1, the first output 112, switch SW9, and resistor R. The first current I1 through resistor R generates the third shared voltage VS3. As shown in FIG. 2A, the first input of switching control circuit 150 receives the third shared voltage VL3, which is substantially constant over the time t1-t2.

Referring back FIGS. 2A-2B, at time t2, the third leg voltage VL3 on the second input of switching control circuit 150 exceeds the third shared voltage VS3 on the first input of switching control circuit 150. As shown in FIGS. 2C-2F, when the third leg voltage VL3 exceeds the third shared voltage VS3, switching control circuit 150 changes the logic state of the first switching signal SS1 from a logic high to a logic low, and changes the logic state of the second switching signal SS2 from a logic low to a logic high. In addition, switching control circuit 150 changes the logic state of the third switching signal SS3 from a logic low to a logic high, and changes the logic state of the fourth switching signal SS4 from a logic high to a logic low.

Figure 3C:
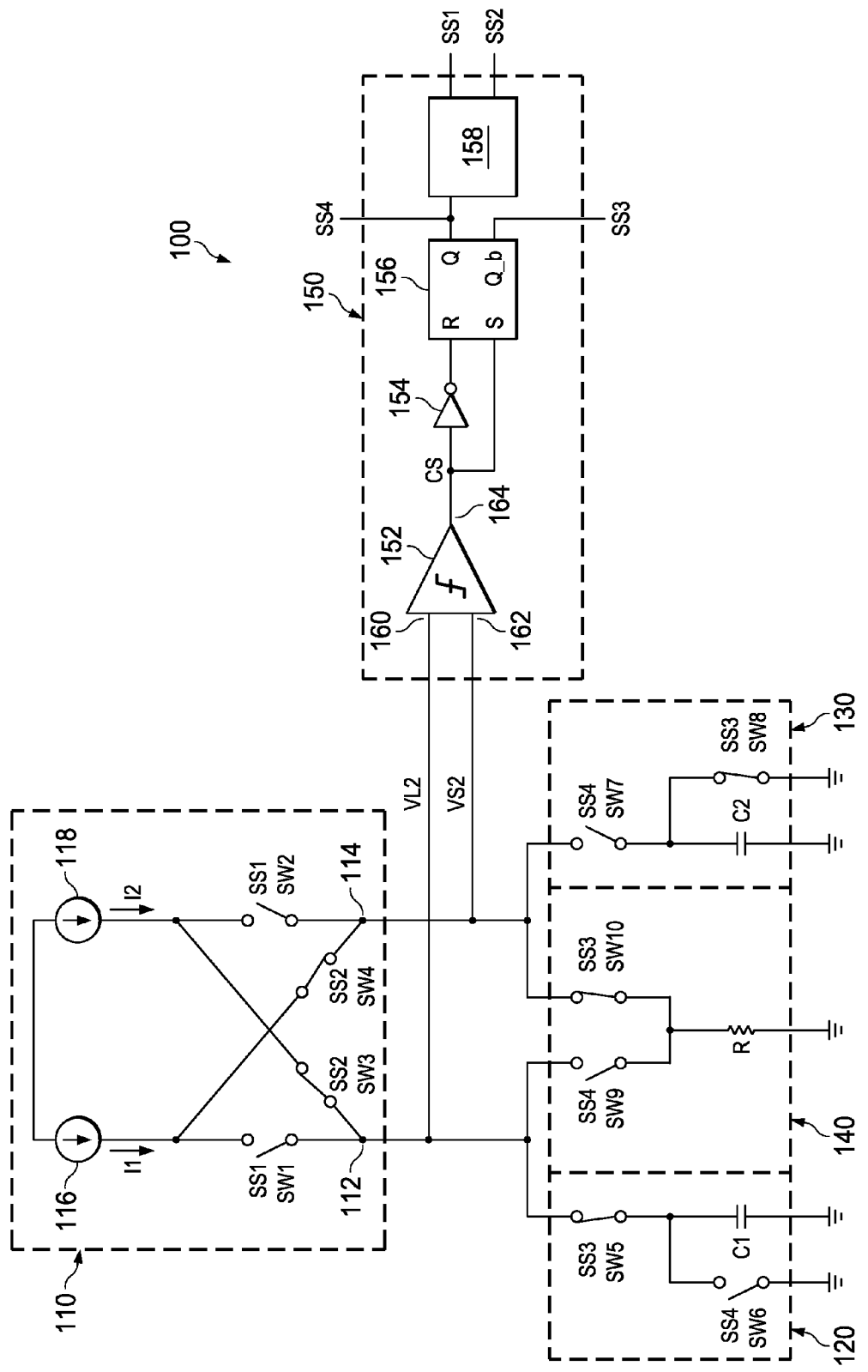

As shown in FIG. 3C, when the first switching signal SS1 and the fourth switching signal SS4 change to a logic low state, and the second switching signal SS2 and the third switching signal SS3 change to a logic high state, the switches SW3, SW4, SW5, SW8, and SW10 close, while the switches SW1, SW2, SW6, SW7, and SW9 open.

In this state, capacitor C2 discharges through switch SW8, while the second current I2 from current source 118 flows through switch SW3, the first output 112, and switch SW5 to capacitor C1, where the second current I2 charges up capacitor C1 to generate the second leg voltage VL2. As shown in FIG. 2A, the first input of switching control circuit 150 receives the second leg voltage VL2, which increases over the time t2-t3.

At the same time, the first current I1 from current source 116 flows through switch SW4, the second output 114, switch SW10, and resistor R. The first current I1 through resistor R generates the second shared voltage VS2. As shown in FIG. 2B, the second input of switching control circuit 150 receives the second shared voltage VS2, which is substantially constant over the time t2-t3.

Referring again to FIGS. 2A-2B, at time t3, the second leg voltage VL2 on the first input of switching control circuit 150 exceeds the second shared voltage VS2 on the second input of switching control circuit 150. As shown in FIGS. 2C-2F, when the second leg voltage VL2 exceeds the second shared voltage VS2, switching control circuit 150 changes the logic state of the third switching signal SS3 from a logic high to a logic low, and changes the logic state of the fourth switching signal SS4 from a logic low to a logic high.

Figure 3D:
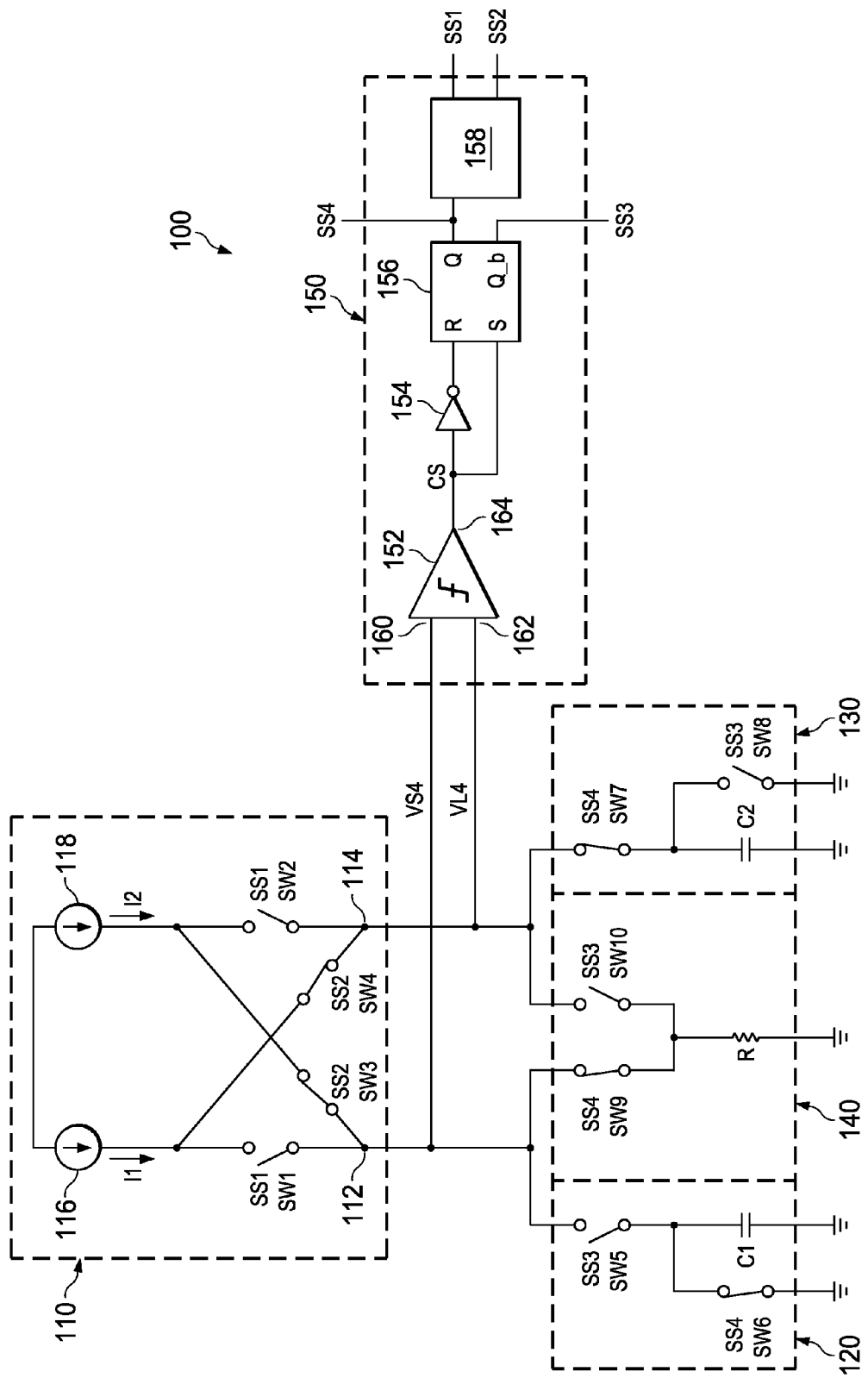

As shown in FIG. 3D, when the third switching signal SS3 changes to a logic low state and the fourth switching signal SS4 changes to a logic high state, the switches SW5, SW8, and SW10 open, while the switches SW6, SW7, and SW9 close. The switches SW3 and SW4 remain closed, while the switches SW1 and SW2 remain open.

In this state, capacitor C1 discharges through switch SW6, while the first current I1 from current source 116 flows through switch SW4, the second output 114, and switch SW7 to capacitor C2, where the first current I1 charges up capacitor C2 to generate the fourth leg voltage VL4. As shown in FIG. 2B, the second input of switching control circuit 150 receives the fourth leg voltage VL4, which increases over the time t3-t4.

At the same time, the second current I2 from current source 118 flows through switch SW3, the first output 112, switch SW9, and resistor R. The second current I2 through resistor R generates the fourth shared voltage VS4. As shown in FIG. 2A, the first input of switching control circuit 150 receives the fourth shared voltage VS4, which is substantially constant over the time t3-t4.

Referring back to FIGS. 2A-2B, at time t4, the fourth leg voltage VL4 on the second input of switching control circuit 150 exceeds the fourth shared voltage VS4 on the first input of switching control circuit 150. As shown in FIGS. 2C-2F, when the fourth leg voltage VL4 exceeds the fourth shared voltage VS4, switching control circuit 150 changes the logic state of the first switching signal SS1 from a logic low to a logic high, and changes the logic state of the second switching signal SS2 from a logic high to a logic low. In addition, switching control circuit 150 changes the logic state of the third switching signal SS3 from a logic low to a logic high, and changes the logic state of the fourth switching signal SS4 from a logic high to a logic low. The operation then continues in the same manner.

Referring back to FIG. 1, switching control circuit 150 can be implemented in a number of different ways to produce the switching signals SS1-SS4 illustrated in FIGS. 2A-2D in response to the voltages shown in FIGS. 2A-2B. In the present example, switching control circuit 150 is implemented with a non-inverting comparator 152, an inverter 154, a RS flip-flop 156, and a frequency divider 158. Comparator 152 has a positive input 160 coupled to the first output 112, a negative input 162 coupled to the second output 114, and a comparison output 164 that outputs a switching control signal CS.

Inverter 154 has an input and an output, with the input coupled to the switching control output 164 of comparator 152. RS flip-flop 156 has an R input coupled to the output of inverter 154, and an S input coupled to the switching control output 164 of comparator 152. RS flip-flop 156 additionally has a Q output that generates the fourth switching signal SS4, and an inverted Q output (Q_b) that generates the third switching signal SS3. Frequency divider 158 has an input coupled to receive the fourth switching signal SS4, a first divider output that generates the first switching signal SS1, and a second divider output that generates the second switching signal SS2.

In operation, when comparator 152 outputs the switching control signal CS with a logic low, such as at time t0 in FIGS. 2A-2F, a logic high is placed on the R input and a logic low is placed on the S input of RS flip-flop 156. The logic high on the R input and the logic low on the S input causes the Q output of RS flip-flop 156 to output the fourth switching signal SS4 with a logic low, while the inverted Q output generates the third switching signal SS3 a logic high. The logic low output by the Q output of RS flip-flop 156 causes frequency divider 158 to output the first switching signal SS1 with a logic high and the second switching signal SS2 with a logic low.

When comparator 152 changes and outputs the switching control signal CS with a logic high, such as at time t1 in FIGS. 2A-2F, a logic low is placed on the R input and a logic high is placed on the S input of RS flip-flop 156. The logic low on the R input and the logic high on the S input causes the Q output of RS flip-flop 156 to output the fourth switching signal SS4 with a logic high, while the inverted Q output generates the third switching signal SS3 a logic low. The change in logic states has no effect on frequency divider 158, which continues to output the first switching signal SS1 with a logic high and the second switching signal SS2 with a logic low.

When comparator 152 again changes and outputs the switching control signal CS with a logic low, such as at time t2 in FIGS. 2A-2F, a logic high is placed on the R input and a logic low is placed on the S input of RS flip-flop 156. The logic high on the R input and the logic low on the S input causes the Q output of RS flip-flop 156 to output the fourth switching signal SS4 with a logic low, while the inverted Q output generates the third switching signal SS3 with a logic high. The logic low output by the Q output of RS flip-flop 156 causes frequency divider 158 to change the logic state of the first switching signal SS1 from a logic high to a logic low, and change the logic state of the second switching signal SS2 from a logic low to a logic high.

When comparator 152 next changes and outputs the switching control signal CS with a logic high, such as at time t3 in FIGS. 2A-2F, a logic low is placed on the R input and a logic high is placed on the S input of RS flip-flop 156. The logic low on the R input and the logic high on the S input causes the Q output of RS flip-flop 156 to output the fourth switching signal SS4 with a logic high, while the inverted Q output generates the third switching signal SS3 a logic low. The change in logic states has no effect on frequency divider 158, which continues to output the first switching signal SS1 with a logic low and the second switching signal SS2 with a logic high.

One of the advantages of relaxation oscillator 100 is that relaxation oscillator 100 cancels the current and voltage offsets by switching the first current I1 and the second current I2 after each period of the first and second switching signals SS3 and SS4 so that the first and second currents I1 and I2 alternate between the first output 112 and the second output 114. Cancelling the current and voltage offsets reduces temperature dependence and phase noise at low offset frequency.

The current and voltage offsets are present in the equations that define one period of the first and second switching signals SS1 and SS2. The time it takes for the first leg voltage VL1 to rise during the time t0-t1 is equal to $(I_2R+VOS)(C)/(I_1)$, where VOS is the offset voltage. The time it takes for the second leg voltage VL2 to rise during the time t1-t2 is equal to $(I_1R-VOS)(C)/(I_2)$. The time it takes for the third leg voltage VL3 to rise during the time t2-t3 is equal to $(I_1R+VOS)(C)/(I_2)$. The time it takes for the fourth leg voltage VL4 to rise during the time t3-t4 is equal to $(I_2R-VOS)(C)/(I_1)$.

Summing the four equations together yields $2RC(I_2/I_1+I_1/I_2)$. The difference between the first and second currents $I_1$ and $I_2$ can be written algebraically as $I_1/I_2=1+\alpha$ and $I_2/I_1=1-\alpha$, where $\alpha$ is the current offset. Substitute in the values for $I_1/I_2$ and $I_2/I_1$ yields 4RC, which illustrates that the current offset term $\alpha$ and the offset voltage term VOS both cancel out. Accordingly, relaxation oscillator 100 utilizes current and voltage offset cancellation to reduce temperature sensitivity and phase noise at low offset frequency.

Although illustrative embodiments have been shown and described by way of example, a wide range of alternative embodiments is possible within the scope of the foregoing disclosure.

What is claimed is:

1. Circuitry for a relaxation oscillator, comprising:
a current swapping circuit having a first output and a second output, the current swapping circuit for sourcing a first current from the first output and a second current from the second output in response to a first logic state of a first switching signal and a second logic state of a second switching signal, and sourcing the first current from the second output and the second current from the first output in response to a second logic state of the first switching signal and a first logic state of the second switching signal;

a first current leg coupled to the first output of the current swapping circuit, the first current leg for receiving the first current when sourced from the first output and generating a first leg voltage from the first current in response to a first logic state of a third switching signal and a second logic state of a fourth switching signal, and receiving the second current when sourced from the first output and generating a second leg voltage from the second current in response to the first logic state of the third switching signal and the second logic state of the fourth switching signal;

a second current leg coupled to the second output of the current swapping circuit, the second current leg for receiving the second current when sourced from the second output and generating a third leg voltage from the second current in response to a second logic state of the third switching signal and a first logic state of the fourth switching signal, and receiving the first current when sourced from the second output and generating a fourth leg voltage from the first current in response to the second logic state of the third switching signal and the first logic state of the fourth switching signal; and a shared current leg coupled to the first output and the second output of the current swapping circuit, the shared current leg for:
receiving the second current when sourced from the second output, and generating a first shared voltage from the second current in response to the first logic state of the third switching signal and the second logic state of the fourth switching signal;
receiving the first current when sourced from the second output, and generating a second shared voltage from the first current in response to the first logic state of the third switching signal and the second logic state of the fourth switching signal;
receiving the first current when sourced from the first output, and generating a third shared voltage from the first current in response to the second logic state of the third switching signal and the first logic state of the fourth switching signal; and receiving the second current when sourced from the first output, and generating a fourth shared voltage from the second current in response to the second logic state of the third switching signal and the first logic state of the fourth switching signal.

2. The relaxation oscillator circuitry of claim 1 and further comprising a switching control circuit coupled to the current swapping circuit, the first current leg, the second current leg, and the shared current leg, the switching control circuit for
comparing the first leg voltage to the first shared voltage, and changing a logic state of the third switching signal and a logic state of the fourth switching signal when the first leg voltage exceeds the first shared voltage;
comparing the third leg voltage to the third shared voltage, and changing a logic state of the first switching signal, a logic state of the second switching signal, the logic state of the third switching signal, and the logic state of the fourth switching signal when the third leg voltage exceeds the third shared voltage;
comparing the second leg voltage to the second shared voltage, and changing the logic state of the third switching signal and the logic state of the fourth switching signal when the second leg voltage exceeds the second shared voltage; and
comparing the fourth leg voltage to the fourth shared voltage, and changing the logic state of the first switching signal, the logic state of the second switching signal, the logic state of the third switching signal, and the logic state of the fourth switching signal when the fourth leg voltage exceeds the fourth shared voltage.

3. The relaxation oscillator circuitry of claim 2 wherein the current swapping circuit includes:
a first current source for generating the first current;
a second current source for generating the second current;
a first switch having a control terminal coupled to receive the first switching signal, a first terminal coupled to the first current source, and a second terminal coupled to the first output;
a second switch having a control terminal coupled to receive the first switching signal, a first terminal coupled to the second current source, and a second terminal coupled to the second output;
a third switch having a control terminal coupled to receive the second switching signal, a first terminal coupled to the second current source, and a second terminal coupled to the first output; and
a fourth switch having a control terminal coupled to receive the second switching signal, a first terminal coupled to the first current source, and a second terminal coupled to the second output.

4. The relaxation oscillator circuitry of claim 3 wherein the first current leg includes:
a fifth switch having a control terminal coupled to receive the third switching signal, a first terminal coupled to the first output, and a second terminal;
a sixth switch having a control terminal coupled to receive the fourth switching signal, a first terminal coupled to the second terminal of the fifth switch, and a second terminal coupled to ground; and
a capacitor having a top plate coupled to the second terminal of the fifth switch, and a bottom plate coupled to ground.

5. The relaxation oscillator circuitry of claim 4 wherein the second current leg includes:
a seventh switch having a control terminal coupled to receive the fourth switching signal, a first terminal coupled to the second output, and a second terminal;
an eighth switch having a control terminal coupled to receive the third switching signal, a first terminal coupled to the second terminal of the seventh switch, and a second terminal coupled to ground; and
a capacitor having a top plate coupled to the second terminal of the seventh switch, and a bottom plate coupled to ground.

6. The relaxation oscillator circuitry of claim 5 wherein the shared current leg includes:
a ninth switch having a control terminal coupled to receive the fourth switching signal, a first terminal coupled to the first output, and a second terminal;
a tenth switch having a control terminal coupled to receive the third switching signal, a first terminal coupled to the second output, and a second terminal; and
a resistor having a first end coupled to the second terminal of the ninth switch and the second terminal of tenth switch, and a second end coupled to ground.

7. The relaxation oscillator circuitry of claim 6 wherein the switching control circuit includes a comparator having a positive input coupled to the first output, a negative input coupled to the second output, and a comparison output.

8. The relaxation oscillator circuitry of claim 7 wherein the switching control circuit further includes:
an inverter coupled to the comparison output,
a flip-flop coupled to the comparison output and the inverter; and
a frequency divider coupled to the flip-flop.

9. The relaxation oscillator circuitry of claim 7 wherein flip-flop is a RS flip-flop with an R input coupled to the inverter, an S input coupled to the comparison output, a Q output coupled to the frequency divider, and an inverted Q output.

10. The relaxation oscillator circuitry of claim 9 wherein Q output generates the third switching signal and the inverted Q output generates the fourth switching signal.

11. The relaxation oscillator circuitry of claim 10 wherein the fourth switching signal is an inverse of the third switching signal.

12. A method of operating a relaxation oscillator, the method comprising:
sourcing a first current from a first output and a second current from a second output in response to a first logic state of a first switching signal and a second logic state of a second switching signal;
sourcing the first current from the second output and the second current from the first output in response to a second logic state of the first switching signal and a first logic state of the second switching signal;
receiving the first current when sourced from the first output and generating a first leg voltage from the first current in response to a first logic state of a third switching signal and a second logic state of a fourth switching signal;
receiving the second current when sourced from the first output and generating a second leg voltage from the second current in response to the first logic state of the third switching signal and the second logic state of the fourth switching signal;
receiving the second current when sourced from the second output and generating a third leg voltage from the second current in response to a second logic state of the third switching signal and a first logic state of the fourth switching signal;
receiving the first current when sourced from the second output and generating a fourth leg voltage from the first current in response to the second logic state of the third switching signal and the first logic state of the fourth switching signal;

receiving the second current when sourced from the second output, and generating a first shared voltage from the second current in response to the first logic state of the third switching signal and the second logic state of the fourth switching signal;

receiving the first current when sourced from the second output, and generating a second shared voltage from the first current in response to the first logic state of the third switching signal and the second logic state of the fourth switching signal;

receiving the first current when sourced from the first output, and generating a third shared voltage from the first current in response to the second logic state of the third switching signal and the first logic state of the fourth switching signal; and receiving the second current when sourced from the first output, and generating a fourth shared voltage from the second current in response to the second logic state of the third switching signal and the first logic state of the fourth switching signal.

13. The method of claim 12 and further comprising:

comparing the first leg voltage to the first shared voltage, and changing a logic state of the third switching signal and a logic state of the fourth switching signal when the first leg voltage exceeds the first shared voltage;

comparing the third leg voltage to the third shared voltage, and changing a logic state of the first switching signal, a logic state of the second switching signal, the logic state of the third switching signal, and the logic state of the fourth switching signal when the third leg voltage exceeds the third shared voltage;

comparing the second leg voltage to the second shared voltage, and changing the logic state of the third switching signal and the logic state of the fourth switching signal when the second leg voltage exceeds the second shared voltage; and comparing the fourth leg voltage to the fourth shared voltage, and changing the logic state of the first switching signal, the logic state of the second switching signal, the logic state of the third switching signal, and the logic state of the fourth switching signal when the fourth leg voltage exceeds the fourth shared voltage.

14. The method of claim 13 wherein the third leg voltage is compared to the third shared voltage after the first leg voltage exceeds the first shared voltage, and the second leg voltage is compared to the second shared voltage after the third leg voltage exceeds the third shared voltage.

15. The method of claim 14 wherein the first leg voltage rises over a period of time.

16. The method of claim 15 wherein the first shared voltage is substantially constant over the period of time.

* * * * *